United States Patent [19]

Weber

[11] Patent Number: 4,574,280

[45] Date of Patent: Mar. 4, 1986

[54] GAS DISCHARGE LOGIC DEVICE FOR USE WITH AC PLASMA PANELS

[75] Inventor: Larry F. Weber, Champaign, Ill.

[73] Assignee: The Board of Trustees of The University of Illinois, Urbana, Ill.

[21] Appl. No.: 462,029

[22] Filed: Jan. 28, 1983

[51] Int. Cl.[4] .......................... G09G 3/22; G09G 3/10
[52] U.S. Cl. .................................. 340/771; 340/775; 340/718; 315/169.4
[58] Field of Search ............... 340/771, 775, 718, 719; 315/169.4

[56] References Cited

U.S. PATENT DOCUMENTS

| | | | |
|---|---|---|---|
| 3,881,129 | 4/1975 | Nakayama et al. | 340/775 |
| 4,044,349 | 8/1977 | Andoh et al. | 340/775 X |
| 4,079,370 | 3/1978 | Mikoshiba et al. | 340/775 X |
| 4,190,788 | 2/1980 | Yoshikawa et al. | 315/169.4 |
| 4,368,467 | 1/1983 | Unoturo et al. | 340/771 X |

OTHER PUBLICATIONS

"Discharge-Logic Drive Schemes" J. D. Schermerhorn and J. W. V. Miller, *IEEE Transactions on Electrical Devices*, vol. ED-22, No. 9, Sep. 1975, pp. 669-673.
"Coupled-Matrix, Threshold-Logic AC Plasma Display Panel", T. N. Criscimagna, J. R. Beidl, M. Steinmetz and J. Hevesi, *Proceeding of the SID.*, vol. 17/4, 4th Quarter 1976, pp. 176-179.

Primary Examiner—Marshall M. Curtis
Assistant Examiner—Vincent P. Kovalick
Attorney, Agent, or Firm—Marshall, O'Toole, Gerstein, Murray & Bicknell

[57] ABSTRACT

An AC gas discharge logic device with two input electrodes and an output electrode isolated by dielectric material from a dischargeable gas. Upon coupling suitable signals to the input electrodes, the gas is discharged and a voltage level at the dielectric material associated with the input electrodes is established which is different than the initial voltage level at the dielectric material associated with the output electrode. The subsequent voltage level of the output electrode after the gas discharge thus approaches the established voltage level at the input electrodes. An AC gas discharge panel with a plurality of the aforementioned logic devices included within the panel structure.

14 Claims, 11 Drawing Figures

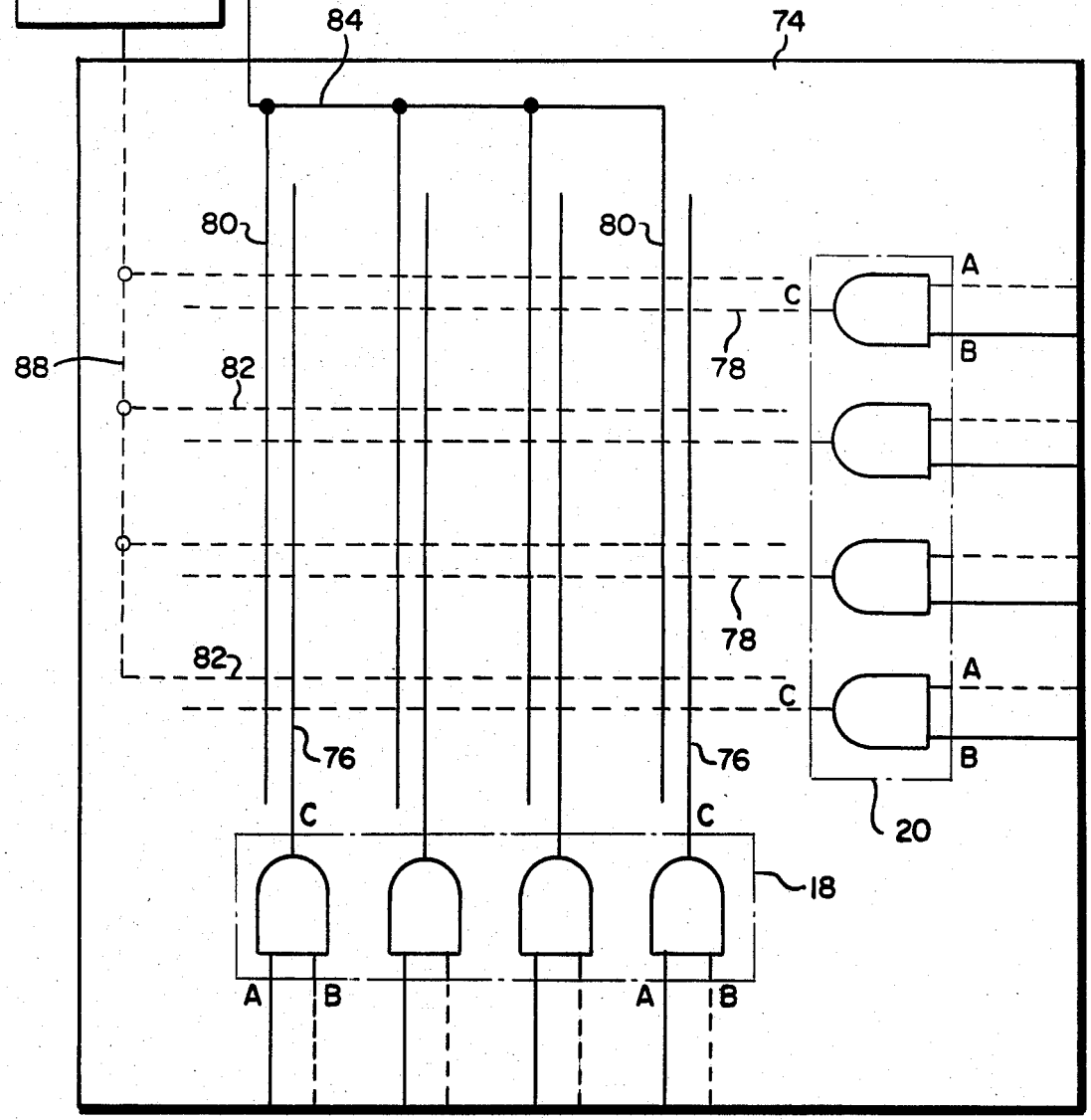

GAS DISCHARGE LOGIC DEVICE FOR USE WITH AC PLASMA PANELS

This invention relates to AC gas discharge panels, and in particular to gas discharge logic devices useful for reducing the number of drive circuits required for addressing such panels.

BACKGROUND OF THE INVENTION

The present invention is directed to gaseous discharge display apparatus of the type commonly known as a plasma display panel or AC plasma panel as described in U.S. Pat. No. 3,559,190. The plasma panel includes a pair of dielectric members with a respective array of panel electrodes isolated from a gaseous medium. By coupling a suitable drive circuit to respective electrodes in the commonly configured row and column panel array, the associated intersecting display cell or "pixel" on the panel can be displayed. Reference may be made to the aforementioned U.S. patent in which there is indicated a variety of addressing techniques for entering information into the plasma panel as well as techniques for sustaining the displayed information in the panel after addressing.

The AC plasma display panel has been the most commercially successful flat panel display technology used for large computer terminal displays. It is second only to the cathode ray tube in the number of computer terminals sold. The most costly portion of presently available AC plasma display systems is the electronic drive circuits. For instance, a 512×512 AC plasma display panel (i.e., one having an array of 512 row panel electrodes and 512 column panel electrodes) requires 1024 panel electrode drive circuits. Although integrated circuits have significantly reduced the cost of these drivers, the circuit part of the display system is still the major part of the total system cost. The thousand or so drivers required for a plasma display is frequently compared to the approximately 10 drive circuits required by a cathode ray tube. Thus, circuit costs are a major reason for the cathode ray tube's cost advantage over plasma displays.

It is thus desired to drastically reduce the adressing or drive circuit costs for plasma panels without significantly increasing the plasma panel manufacturing costs.

One proposed solution is to make the plasma display panel behave as a shift register and thereby provide a "shift panel". Addressing speed is low because a discharge point or pixel on the panel is accessed only after the information is shifted through many other pixels. Large size panels cannot be made because the shift panel yield is low. Yields are low because every pixel in a shift panel must be good and reliably capable of display (i.e., without cell contamination or broken panel electrodes) or the rest of the information in the line will be lost. Display panels with missing lines are not commercially usable. Most shift panels will shift in only one dimension so that the savings in drive circuits influences only that dimension. For instance, a 512×512 shift panel could be accomplished by 512+3=515 circuit drivers which is about half of the 1024 required by a standard plasma panel. However, this circuit driver reduction may be offset by the increased cost of the plasma panel due to reduced yield of the more complicated shift panel. Thus, the shift technique is probably not the ultimate solution to the panel drive circuit problem.

Another proposed technique for reducing the number of drive circuits in a plasma display utilizes gas discharge logic. Reference may be made for instance to the following published articles: (1) "Discharge-Logic Drive Schemes", by J. D. Schermerhorn and J. W. V. Miller, *IEEE Transactions On Electron Devices*, Vol. ED-22, No. 9, September 1975, pages 669-673; (2) "Coupled-Matrix, Threshold- Logic AC Plasma Display Panel", T. N. Criscimagna, J. R. Beidl, M. Steinmetz and J. Hevesi, *Proceeding of the SID*, Vol. 17/4, 4th Quarter 1976, pages 176-179.

In such proposed gas discharge logic addressing techniques, each discharge point or display pixel on the plasma panel is provided with two row (X) electrodes and two column (Y) electrodes. A particular pixel is selected for display only if suitable signals are provided on all four input electrodes, and thus the pixel can be considered a four input AND gate. The input panel electrodes for each pixel are grouped such that for a 512×512 panel only 48 circuit drivers for the row electrodes and 48 circuit drivers for the column electrodes, or a total of 96 circuit drivers are required. In the addressing configuration, each row and column axis may contain groups of 32 electrodes connected in parallel to one driver circuit and groups of 16 electrodes also connected in parallel to a single driver circuit.

Such a proposed technique has led to significant problems. First, the electrodes are grouped together and connected to conductor buses in a way that requires electrical crossovers in the panel. The crossovers must be of low capacitance and must withstand voltage breakdown due to the address pulses, which renders manufacturing of a suitable plasma panel significantly more complex. Another major problem is the significant increase in capacitance which the address circuits must drive compared to a conventional plasma panel. For example, in the case of a 512×512 panel, where 32 electrodes are connected in parallel and to one driver, the capacitive load on each driver circuit is increased by 32 times. In addition, the double electrode structure per pixel will increase the capacitance of each electrode as seen by the drivers. Thus, the capacitance viewed by an addressing or driver circuit for this technique can be as much as 100 times greater, for a 512×512 panel, as compared to a conventional panel.

Furthermore, since the capacitive load on each driver is increased by a factor of 32, the discharge current of each panel electrode will also increase by a factor of 32 utilizing this proposed technique. Increasing the drive current requirement by a factor of 32 requires a proportional increase in the output circuit silicon area of an integrated circuit driver, which may lead to obtaining considerably fewer output drivers and associated circuits on an integrated circuit chip. Thus, the reduction in the number of drive circuit connections to the plasma panel theoretically obtainable with this proposed technique may not significantly reduce the number of integrated circuit chips because of the resulting greatly decreased number of output circuits per chip. Since most of the cost of the integrated circuit is in the packaging, there also may be no significant cost advantage of this heretofore proposed gas discharge logic technique for addressing plasma panels as compared to a conventional plasma panel system because of the roughly equivalent number of integrated circuit chips required to drive each panel in the respective systems.

It is therefore desired to provide a gas discharge logic device which would be particularly adaptable for use in addressing AC plasma panels to reduce the number of panel eletrode drive circuits normally required for the panel and which would provide the following features: (1) Does not significantly increase the capacitive load and the current load of the output drivers over that of a conventional system so that existing integrated circuit drivers can be used; (2) Does not require electrical crossovers on the plasma panel so that the plasma panel need not be manufactured with electrical feedthroughs or other complicated and costly panel processing steps; (3) Ideally the new technique should require little more than a mask change for a new panel electrode pattern during panel construction, and a new set of panel electrode drive waveforms; (4) Any new panel electrode pattern should not require critical registration steps that significantly reduce the plasma panel yield.

SUMMARY OF THE INVENTION

In accordance with the principles of the present invention, there is provided an AC gas discharge logic device with two input electrodes and an output electrode isolated by dielectric material from a dischargeable gaseous medium. The dielectric material, electrodes and gaseous medium are configured so as to be adapted for responding to signals coupled to designated input electrodes (A and B) to discharge the gaseous medium and form a dielectric voltage level at the input electrodes (A and B) after discharge which is different than the initial dielectric voltage level at a designated output electrode (C). This enables the subsequent voltage level at the output electrode (C) to approach the dielectric voltage level, formed after the discharge, at the input electrodes (A and B). Accordingly, the device can be considered an AND gate since a desired output voltage level is provided only if suitable signals are coupled to the input electrodes.

Another significant aspect of the present invention is in incorporating the aforementioned unique AC gas discharge logic devices within a plasma panel by locating the devices around the perimeter of the plasma panel display area. When so incorporated in a 512×512 plasma panel, only 96 driver circuits are required rather than the 1024 driver circuits in a conventional plasma panel configuration. Preferably, each AC gas discharge logic device according to the present invention may be constructed with opposing dielectric members containing a gaseous medium sealed therebetween, with two electrodes associated with one dielectric member and a corresponding electrode associated with the opposite dielectric member, in a supporting, paired substrate structure very similar to that of a conventional AC plasma display panel. Thus, the AND gate electrodes can readily be incorporated in the electrode photomasks for the panel electrodes during construction of a conventional plasma panel so that no additional panel processing steps are required and prior required electrode crossovers are avoided.

Furthermore, when so incorporated in a plasma panel, the circuit drivers used to drive the AND gates do not see a load current that is very much greater than the load of a signle electrode of a conventional panel. This is in sharp contrast the circuit driver load of the earlier discussed prior proposed gas discharge logic system. In particular, a significant difference between the present invention and that of the earlier discussed prior discharge logic system resides in that the gas discharge AND gates of the present invention may be incorporated in a plasma panel along the perimeter of the panel display area, whereas in the prior system, the AND gates are located in each pixel.

Further aspects of the present invention reside in techniques for lowering the output impedance of the gas discharge logic elements so that the output impedance of the logic elements is relatively low compared to the input impedance of the plasma panel electrodes. In a still further aspect of the present invention, wherein a modified plasma panel incorporates AND gates of the present invention for addressing the panel and an isolated sustaining circuit for sustaining the entered panel information, the input display section impedance seen by the AND gates is increased.

BRIEF DESCRIPTION OF THE DRAWINGS

Reference may be made to the following description taken in conjunction with the accompanying drawings, in which like reference numerals identify like elements in the several figures and in which:

FIG. 10 illustrates an alternative construction of AC gas discharge logic elements according to this invention and wherein one of the dielectric members is replaced by a thin film of dielectric material or of cermet material; and FIG. 11 schematically illustrates a modified plasma panel array containing AC gas discharge logic devices according to the present invention for addressing the plasma panel and a sustaining circuit isolated from the addressing circuit.

DETAILED DESCRIPTION

Figure 1:
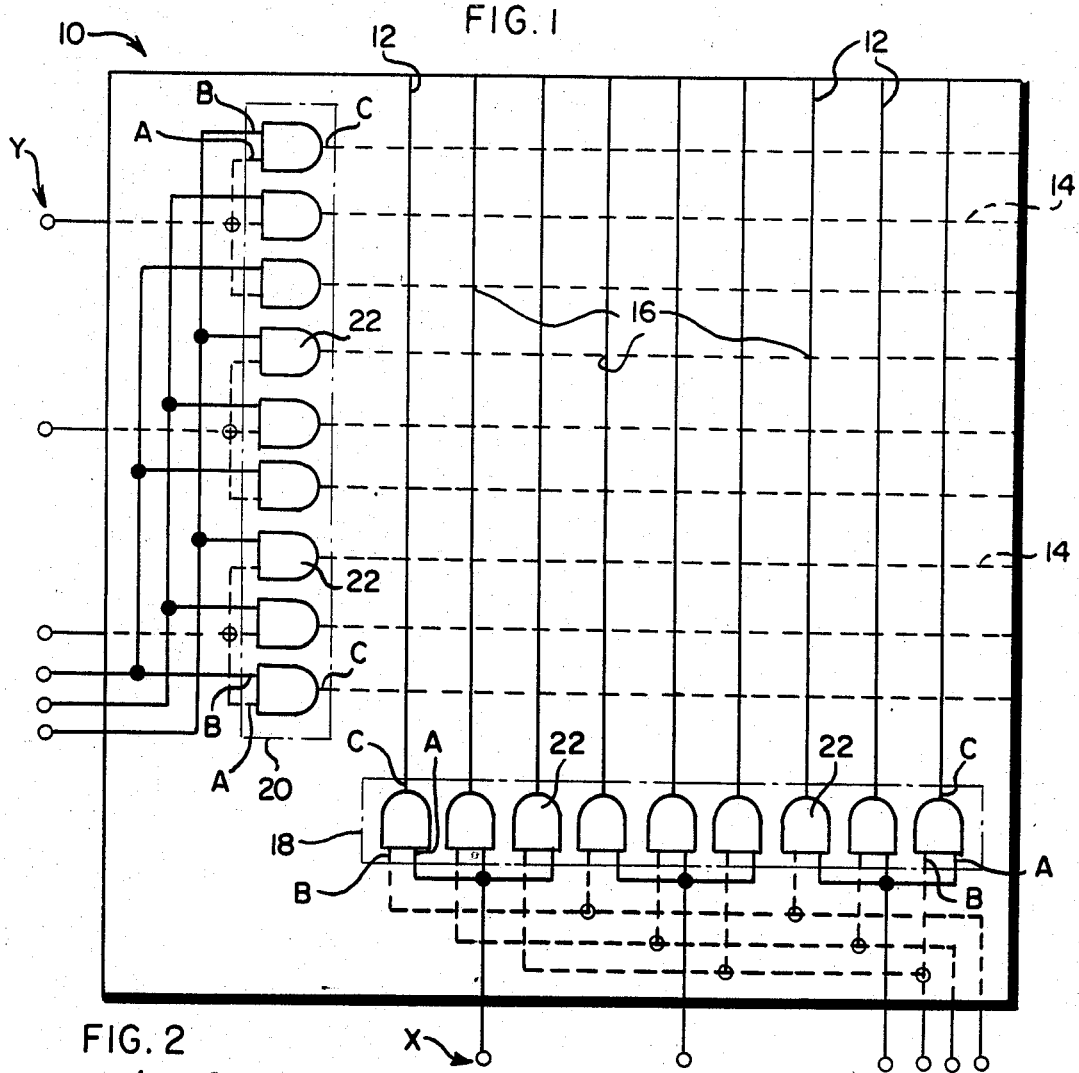
FIG. 1 is a schematic illustration of a 9×9 plasma display panel incorporating AC gas discharge logic elements according to the present invention and within the perimeter of the plasma display panel area.

Reference may be made to FIG. 1, in which there is illustrated an AC plasma panel 10 with an array of column panel electrodes 12 on one panel substrate and an array of row panel electrodes 14 on an opposing panel substrate. It is to be understood that the panel display area defined by the respective panel electrode arrays is of a conventional construction in which the arrays of panel electrodes are mounted on respective opposing glass support substrates, the panel electrodes are covered with respective glass dielectric members, and the panel substrates are sealed together and contain a dischargeable gaseous medium therebetween. The display area on plasma panel 10 with panel electrode arrays 12, 14 includes associated display points or pixels 16 which may be displayed by addressing respective panel electrodes upon entering such display information into the panel.

Along two perimeters of the plasma panel, there is provided respective groups 18, 20 of AC gas discharge logic devices for addressing panel electrodes 12, 14. For purposes of schematic illustrations, each AC gas discharge logic device 22 within the respective groups 18, 20 are illustrated in FIG. 1 with the common designation for an AND gate logic element, whereas the construction details are shown in FIGS. 2 and 3.

Thus, the plasma panel 10 shown in FIG. 1 is for an illustrative array of 9×9 pixels with the panel electrodes being driven by column group 18 and row group 20 of gas discharge AND gates 22 located around the perimeter of the plasma panel display area. For convenience, the solid electrode lines in FIG. 1 illustrate those electrodes which are mounted on the top support substrate of panel 10, and the dashed lines are used to illustrate those electrodes which are mounted on the bottom support substrate. It may be noted that only 12 external X and Y connections to the AND gates are required to address any pixel in the illustrated 9×9 array. For a 512×512 panel utilizing the principles herein, only 96 external driver circuit connections would be required rather than the 1024 such connections required by a conventional plasma panel system.

Figure 2:
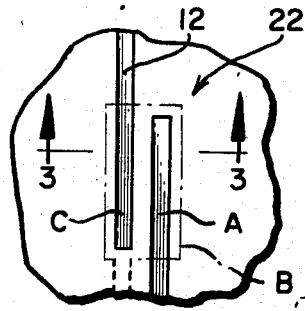
FIG. 2 is an enlarged view of an AC gas discharge logic device in accordance with the present invention.
Figure 3:
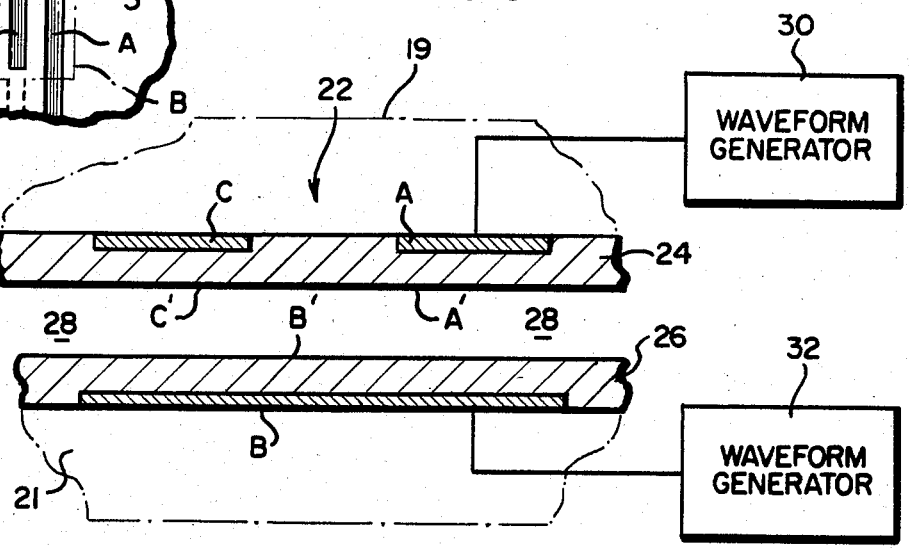
FIG. 3 is a sectional view taken along line 3—3 of FIG. 2 illustrating an AC gas discharge logic device according to the present invention.

FIGS. 2 and 3 illustrate the structural details of AC gas discharge device 22 contained in each group 18, 20, with the respective top and bottom supporting substrates 19 and 21 shown in phantom for purposes of clarity. As an example, FIGS. 2 and 3 illustrate one logic device 22 in group 18 in which input electrode A and output electrode C are mounted on the top panel substrate and covered with a layer of dielectric material, such as dielectric member 24, whereas input electrode B is mounted on the opposite bottom panel substrate and covered with a layer of dielectric material, such as dielectric member 26, with the space between dielectric members 24 and 26 of the respective opposing panel substrates being sealed and filled with a dischargeable gaseous medium 28. As shown in FIG. 2, input electrode B is arranged so as to underlay and encompass the opposing electrodes A and C as well as the area therebetween. It is to be understood that this same construction as shown in FIG. 3 is used for each of the gas discharge logic elements in group 20, except that each input electrode B is mounted on the top substrate with dielectric member 24, and the associated input electrode A and output electrode C are mounted on the bottom substrate with dielectric member 26.

Respective waveform generators 30, 32 are connected to each of the respective input electrodes A and B and provide suitable signal waveforms to produce a pulse on corresponding output electrode C for proper panel addressing. The waveforms must be carefully selected so that a pulse on the output electrode C may occur when there is a selective gas discharge between electrodes A and B.

Figure 4:
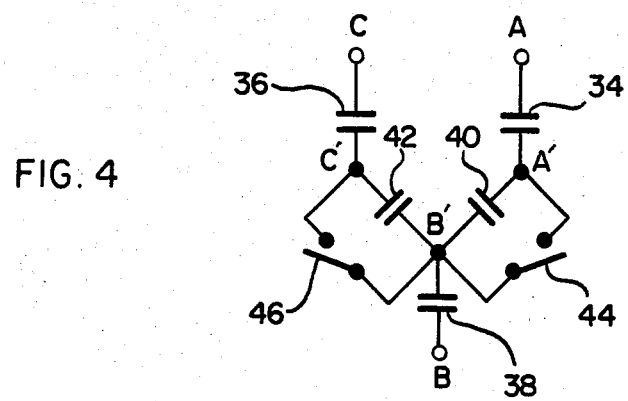
FIG. 4 is a schematic electrical diagram showing an equivalent circuit model useful in explaining the principles of the present invention.

FIG. 4 represents an equivalent circuit model helpful in understanding the principles of the present invention. Capacitors 34, 36 represent the capacitance of dielectric member 24, and capacitor 38 represents the capacitance of dielectric member 26. Capacitor 40 represents the capacitance due to the gaseous medium between points A' and B' on the respective dielectric members shown in FIG. 3. Similarly, capacitor 42 represents the capacitance due to the gaseous medium between points B' and C' on the respective dielectric members in FIG. 3. Switches 44 and 46 schematically illustrate the effect during a gas discharge in which the "switches" close thereby forcing dielectric points A', B' and C' to the same potential.

Figure 5:
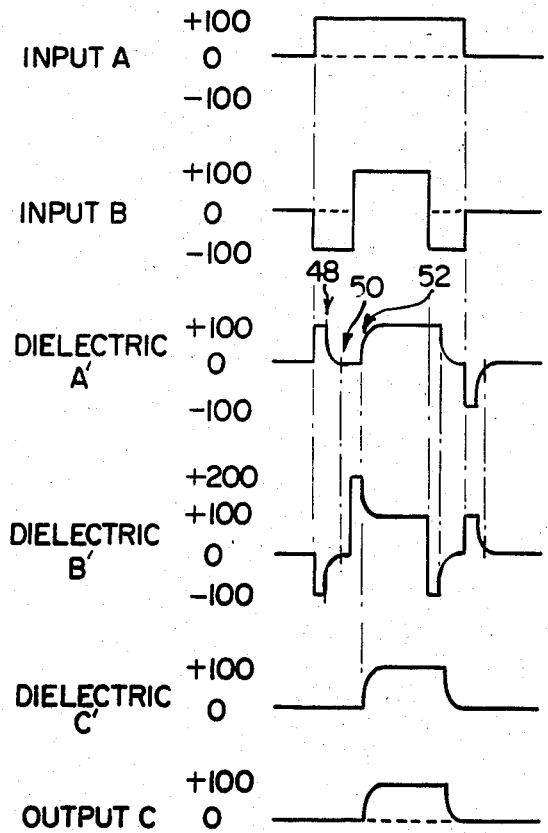
FIG. 5 schematically shows several waveforms including input waveforms A and B taken in conjunction with FIG. 4 for purposes of understanding the principles of the present invention.

FIG. 5 illustrates a waveform at input A supplied from waveform generator 30 and a waveform at input electrode B supplied by waveform generator 32. The resulting waveforms at dielectric points A', B', C' as well as at output electrode C are shown in FIG. 5. It is assumed in connection with FIGS. 4 and 5 that dielectric capacitors 34, 36 and 38 are more than 100 times greater than gas capacitors 40, 42, and that both dielectric members 24, 26 have the same thickness and capacitance. Also, second order affects have been neglected and it is assumed that the output electrode C is not externally loaded.

FIG. 5 represents the resulting conditions at dielectric points A', B', C' where both inputs A and B are logic "one" or "true" (shown in solid lines) to cause output C to become a logic "one" or "true" (also in solid lines). For purposes of illustrating an AND gate operation, the dashed lines show both inputs A and B as logic "zero" which results in a logic "zero" at output C.

Thus, with logic "one" inputs A and B, it may be noted from the solid lines in FIG. 5, that when the discharge potential level is exceeded, such as at time reference point 48, a discharge occurs which forces dielectric points A', B' and C' to the same potential level. As the discharge activity subsides, the discharge "switches" open, and since at time reference point 50 both dielectric point A' and B' are at the same zero potential level as dielectric point C', the output level at electrode C does not change. However, at time reference point 52, another gaseous discharge occurs and after the discharge activity subsides, both dielectric points A' and B' must eventually reach the same +100 volt level, and dielectric point C' must rise to the same +100 volt level. This provides a +100 volt output pulse at output electrode C. Thus, it can be seen that in connection with this second discharge of the gaseous medium, a dielectric voltage level at the respective input electrodes A and B, after the discharge, has been provided which is different than the initial dielectric voltage level at the output electrode C. This enables the subsequent voltage level at output electrode C to approach the respective dielectric voltage level of the input electrodes A and B. With continued application of the input signal waveforms to electrodes A and B, the output voltage level at electrode C is again reduced to its original level thereby providing the pulse shaped output as shown in FIG. 5.

Figure 6:
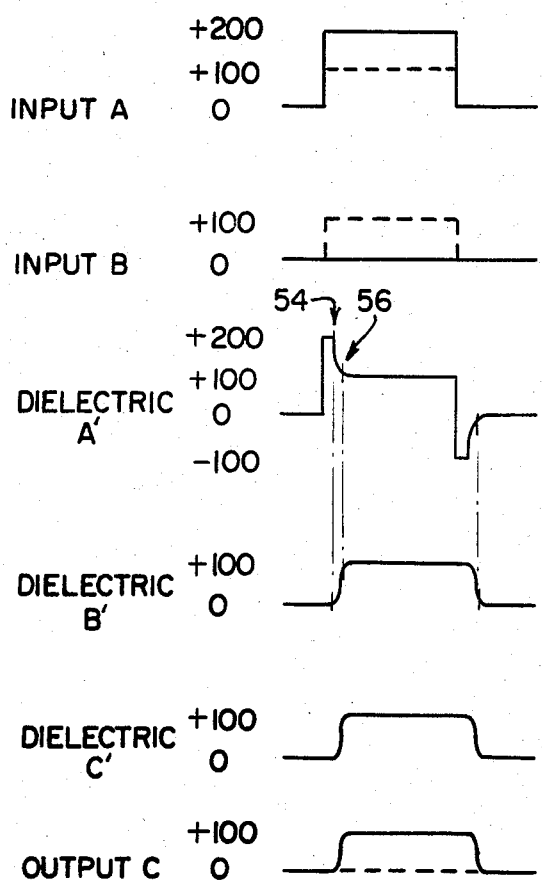
FIG. 6 schematically illustrates further waveforms, including alternative input waveforms A and B.

FIG. 6 in solid lines illustrates the resulting waveforms at dielectric points A', B' and C' as well as the logic "one" at output electrode C resulting from the illustrated alternative logic "one" input waveforms to the respective input electrodes A and B. In particular, it may be noted that upon the first discharge occurring at time reference point 54, dielectric points A' and B' must thereafter go to the same potential, which in the illustrated example is at the +100 volt level shown at time reference point 56. Accordingly, dielectric point C' is forced to the same potential, thereby providing a +100 volt change in the output level at electrode C. A similar pulsing discharge provides the output pulse waveform at electrode C as shown in FIG. 6. The dashed lines show logic "zero" inputs A and B which result in a logic "zero" at output electrode C.

Figure 7:
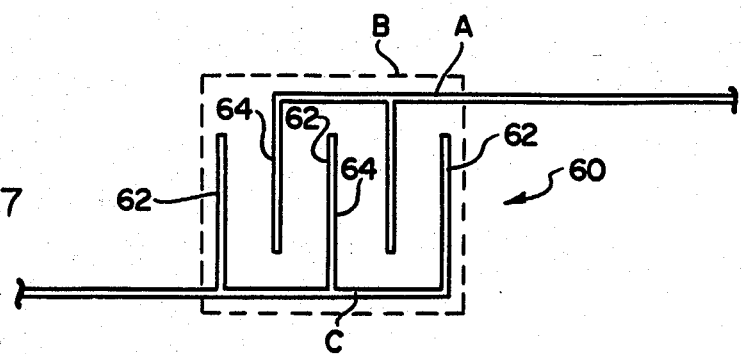
FIG. 7 illustrates an AC gas discharge logic element according to the present invention with the electrodes in a preferred forked and interleaved form.

FIG. 7 illustrates a preferred embodiment of the construction of an AC gas discharge logic element in accordance with this invention. As illustrated, gas discharge element 60 includes input electrode A and output electrode C each in a forked construction and mounted so as to be interleaved on one supporting substrate (not shown). Input electrode B is mounted on an opposing supporting substrate and aligned below electrodes A and C so as to encompass substantially the entire area of the interleaved electrodes A and C. The interleaved electrodes A and C construction shown in FIG. 7 is preferred to the side-by-side electrodes A and C configuration shown in FIGS. 2 and 3, particularly when used in a plasma panel, since a better coupling of the discharge occurring between input electrodes A and B to the output electrode C will be obtained. Also, the interleaved electrode configuration shown in FIG. 7 with three forked members 62 on output electrode C configured around the two forked members 64 on input electrode A helps to provide more registration tolerance between the electrodes and thus aids in the alignment of the electrode arrays on opposite substrates.

Figure 9:
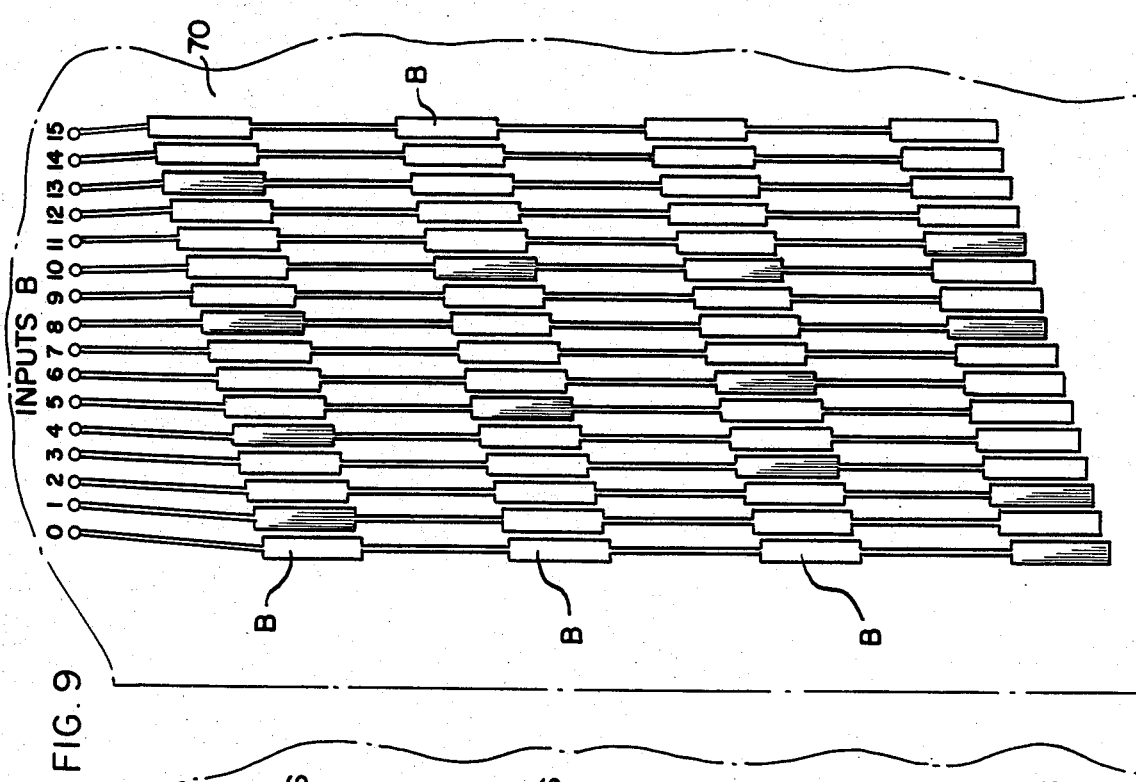
FIG. 9 shows the same plasma panel portion corresponding to that of FIG. 8, and illustrating a 4×16 grouped array of input electrodes B disposed on a substrate opposite to that of the array and substrate shown in FIG. 8.
Figure 8:
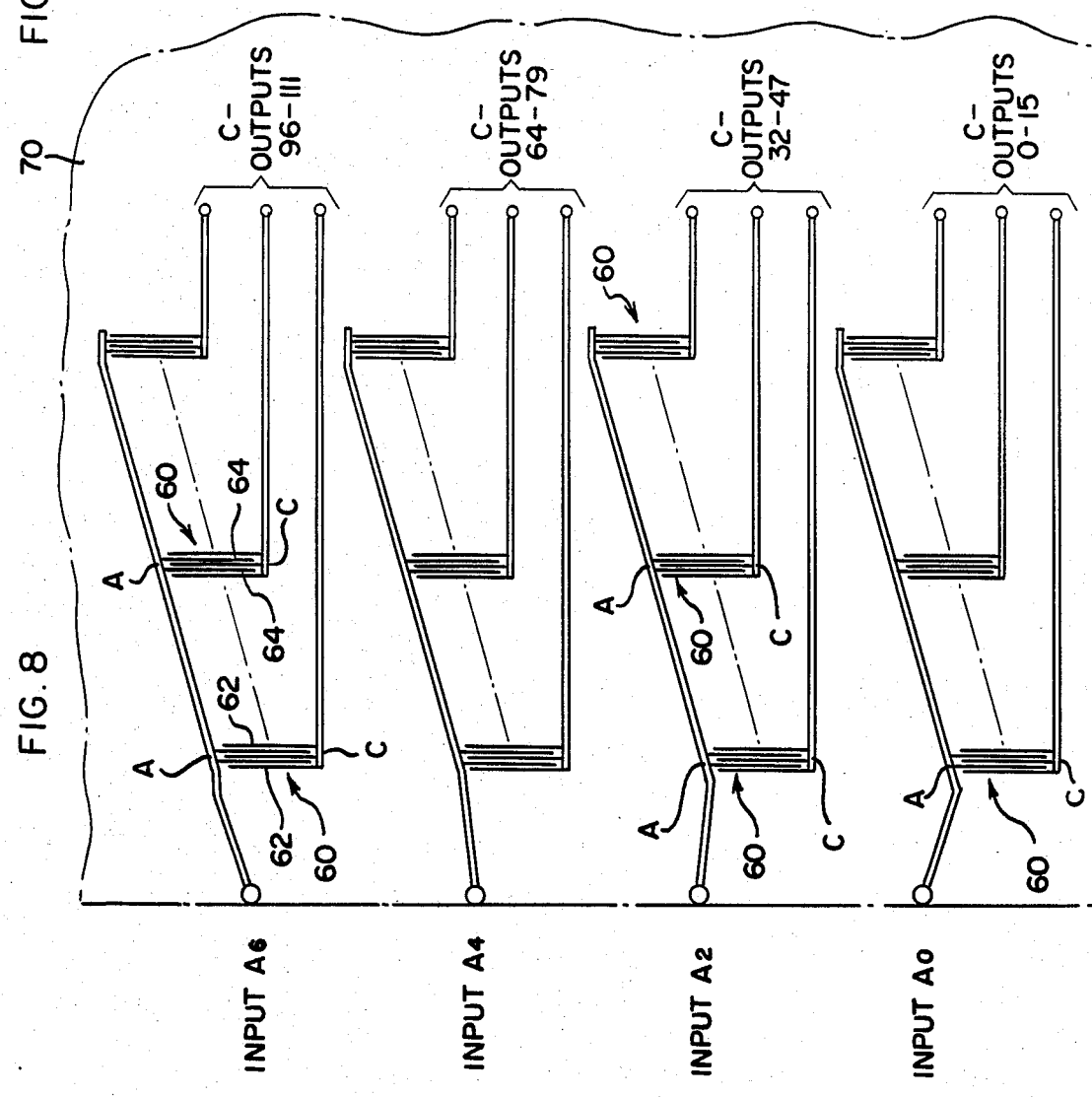
FIG. 8 schematically illustrates one corner of a plasma panel with a plurality of AC gas discharge logic elements according to the present invention along the perimeter of the plasma panel and showing an electrode layout for input electrodes A and output electrode C arranged in a 4×16 grouped array on one substrate.

FIGS. 8 and 9 illustrate a bottom corner portion of respective supporting substrates of a plasma panel 70 containing conventional panel electrodes in the display area (not shown) and incorporating a plurality of AC gas discharge logic devices 60 each constructed as shown in FIG. 7 for addressing the panel electrodes. In particular, the panel 70 shown in FIGS. 8 and 9 provides a plurality of AND gates along the panel perimeter without the need for electrical crossovers. As an example, the portion of panel 70 illustrates an electrode layout for 64 AND gates grouped in a 4×16 array. FIG. 8 shows the upper substrate electrodes with the four input electrode A groups (Groups $A_0, A_2, A_4, A_6$,) each containing 16 logic devices 60 with respective electrode C outputs for each group (0-15; etc.)

FIG. 9 shows the electrode pattern for the lower panel substrate which has 16 B electrode inputs. When the upper and lower substrates are sealed together, the 4×16 array of rectangles representing electrodes B shown on FIG. 9 are aligned under the 4×16 array of interleaved electrodes A and C seen in FIG. 8. It is understood of course, that each of the forked, interleaved structures on the upper substrate shown in FIG. 8, when combined with one of the B electrode rectangles on the lower substrate shown in FIG. 9, forms an AND gate 60. This array of 64 AND gates requires four circuit drivers for the input A electrodes and 16 circuit drivers for the input B electrodes for a total of 20 circuit drivers to drive 64 corresponding plasma panel electrodes for this portion of the panel. It may be particularly noted that the electrode structures do not require any electrical crossovers on either substrate so that panel processing is not impacted in any way other than providing a mask change for the electrode structures shown in FIGS. 8 and 9.

It also may be noted that the circuit drivers used to drive AND gates 60 do not see a load current that is very much greater than the load of a single electrode of a conventional plasma panel. This is in sharp contrast to the driver load seen by prior proposed discharge logic systems. The discharge of the AND gate of the present invention only occurs in the one active gate and therefore there is no significant discharge current passing through any particular driver. The capacitive load of the inputs is also not very large. Of course, the output of the AND gate must drive a plasma panel electrode and this will load the AND gate input drivers. However, since only one plasma panel electrode is addressed at a time, this load is no more than that seen by an address driver of a normal plasma panel that does not use discharge logic.

For the AND gate array to function properly, the output impedance of the AND gate must be sufficiently low to drive the plasma panel electrodes. If AND gate 22 or 60 has too high an impedance, then it will not be able to pulse the plasma panel electrode to a sufficiently high voltage level to cause proper pixel addressing. A typical 512×512 plasma panel electrode has an input capacitance of 20 picofarads and when all 512 pixels along that electrode are discharging, there will be a peak discharge current of 20 milliamperes with an approximate halfwidth of 0.5 microseconds for a total integrated charge of about $5 \times 10^{-9}$ coulombs. The output impedance of the AND gate therefore should be low compared to the input impedance of the plasma panel electrode. The output impedance is determined by the series combination of the gas discharge impedance plus the two dielectric layers' capacitance (See FIG. 4). The gas discharge impedance will depend on the waveforms but it will usually be much lower than the dielectric impedance. Unfortunately, this dielectric impedance is rather high, which would require the area of the AND gate to be rather large to meet the necessary low impedance requirement. There are a few techniques that could be used to drastically reduce the dielectric impedance.

If the dielectric layer, i.e., dielectric member 24 on the upper substrate 19 (see FIG. 3) is eliminated, then the impedance between the output C and input A electrodes will be just that of the gas discharge. This may lower the output impedance of the AND gate by more than a factor of 100 which will make the necessary area of the AND gate much smaller. A major concern with this technique is whether a destructive arc will occur between the electrodes because of the absence of the current limiting action of the dielectric layer. While arcs are always a concern with this type structure, the problem should be manageable with the proper electrode layout because the output of the AND gate is connected to a plasma display line that is completely covered by dielectric material. Even though this dielectric is far removed from the AND gate, it will effectively limit the discharge current in the AND gate and prevent a destructive arc.

The absence of a dielectric layer on the upper substrate of the AND gate should occur only in the area of the AND gates. On that same substrate in the region of the display panel electrodes a dielectric layer should be provided to prevent an arc and to allow proper operation of the display. It is an easy matter to mask off the area of the AND gates on one substrate to prevent application of dielectric material, while retaining a dielectric layer in the display area.

While elimination of dielectric material will solve the impedance problem, it may create new problems. Dependent on the electrode material used, these devices may have serious lifetime problems. All modern AC plasma displays have a thin film coating of MgO over the dielectric layer, i.e., dielectric members 24 and 26 (see FIG. 3). This MgO coating does two things. It makes the operating voltage of the panel very low which is important for low cost drive circuits and it also gives the devices very long operating lifetime. If both the dielectric layer and MgO coating were totally eliminated, depending on the electrode metal used, the operating voltages would probably be high and the lifetime of the plasma panel could be short.

A solution to the above problem is to eliminate the dielectric glass layer 24 but to include a thin film MgO coating 72 over addressing gate electrodes A and C as shown in FIG. 10 (the opposing support substrates being shown in phantom). This will solve both problems. This MgO coating can be applied at the same time as the coating for the display panel electrodes which will make it very easy to apply. It will increase the output impedance of the AND gate slightly but since the MgO is typically 100 times thinner than the normal dielectric glass layer 24, the MgO will have about 100 times lower impedance. This will not increase the output impedance of the AND gate to any great degree.

One possible concern is the dielectric breakdown of the thin MgO film. This is not a serious concern because even though voltages on the order of 100 volts are applied across the AND gate, the high capacitance of the MgO film does not allow a sufficient voltage to be dropped across the film to cause breakdown. Of course, careful engineering must occur to insure that the AND gate is not loaded excessively so that the breakdown voltage of the MgO is exceeded.

A third alternative to lower the AND gate output impedance is to eliminate the dielectric glass layer and instead use a thin film cermet material that is conductive to DC currents. Recent results in the technical literature have shown that when a thin film of cermet material composed of MgO and a metal such as gold or tungsten is used in DC plasma displays, acceptable operation at low voltages with long lifetime is achieved. Such a material would have a low impedance and would not have breakdown problems. It would however, be harder to apply since it would have to be deposited only in the AND gate area and then the MgO would have be put down in the display area only.

Impedance compatibility between the AND gate array and the panel display area might also be achieved by increasing the input impedance of the display panel electrodes. The biggest factor that lowers the input impedance of the display panel area is the discharge current of the pixels when all of the pixels in the line are in the on state. This occurs during the sustain operation. The AND gates are used only during the addressing operation and serve no purpose during the sustain operation.

FIG. 11 illustrates a plasma panel system in which the display section impedance seen by the AND gates is increased. Plasma panel 74 includes a display panel area having an array of column panel electrodes 76 on one substrate coupled to AC discharge AND gate group 18 on the same substrate; and an array of row panel electrodes 78 on an opposing substrate coupled to a group 20 of AC discharge logic gates on the same opposing substrate. It is to be understood that the manner of addressing a particular pixel corresponding to the panel electrodes is provided in the same manner as has been previously described herein.

However, in addition, panel 74 includes another pair of electrodes at each pixel, namely, an array of sustaining column electrodes 80 and an array of sustaining row electrodes 82. Column sustaining electrodes 80 are connected to a buss 84 on the same substrate for coupling to a sustaining signal generator 86. Similarly, the array of sustaining row electrodes 82 are coupled to buss 88 on the respective substrate for connection to sustainer 86.

Therefore, there are two panel electrodes for each pixel, with one of the pairs connected to the gas discharge AND gates for addressing, whereas the other pair is connected to the sustainer for sustaining the previously entered information. No gas discharge logic occurs in the display section of panel 74. The gas discharge logic occurs in AND gates contained within groups 18 and 20 along the panel perimeters as has previously been described to perform the panel addressing functions. This configuration in effect isolates the panel addressing function from the panel sustaining function. Thus, the sustaining function with its attendant requirement to handle a heavier load is presented to sustainer 86 which is designed for this function. On the other hand, the addressing function is attended to by the gas discharge AND gate groups 18, 20 which see only the normal load of about 20 picofarads of panel electrode capacitance and the discharge current of a single pixel that is being addressed, which is negligible.

While the AC gas discharge logic device shown herein has been described as an AND gate with particular adaption for use in plasma panels, other logic devices can be provided as well. Thus, logic gate functions, such as, OR, NOR, NAND, etc., can be provided with suitable waveforms utilizing the principles of the present invention and in accordance with the teachings herein.

The foregoing detailed description has been given for clearness of understanding only, and no unnecessary limitations should be understood therefrom, as modifications will be obvious to those skilled in the art.

What is claimed is:

1. An AC gas discharge logic element for generating high voltage pulses to address a plasma panel comprising spaced dielectric members with associated input electrodes (A & B) and an output electrode (C) which is adapted for connection to the plasma panel, the electrodes isolated by said dielectric members from a dischargeable gaseous medium, and said dielectric members, electrodes and gaseous medium resporting to signals applied to said input electrodes (A & B) for discharging said gaseous medium and to form a dielectric voltage level at the input electrodes (A & B) after discharge which is different than the initial dielectric voltage level at the output electrode (C) prior to said discharge, thereby enabling the subsequent voltage level of the output electrode (C) after said discharge to approach the formed dielectric voltage level at the input electrodes (A & B).

2. An AC gas discharge logic element according to claim 1, wherein the output electrode (C) and one of the input electrodes (A or B) are formed on a common dielectric member.

3. An AC gas discharge logic element according to claim 2, wherein said output electrode (C) and said one of the input electrodes (A or B) are formed with forked portions respectively interleaved.

4. An AC gas discharge logic element according to claim 2, wherein said common dielectric member is formed of a thin film of magnesium oxide.

5. An AC gas discharge logic element according to claim 2, wherein said common dielectric member is formed of a thin film of cermet material.

6. An AC gas discharge panel comprising:
opposing panel substrate members with a respective array of panel electrodes isolated from a gaseous medium;
addressing means for addressing said panel electrodes upon entering information into said panel;
said addressing means including a plurality of AC gas discharge logic elements each having an output electrode (C) connected to a corresponding respective panel address electrode: and
each of said AC gas discharge logic elements including spaced dielectric members with associated input electrodes (A & B) and said output electrode (C), the electrodes isolated by said dielectric members from a dischargeable gaseous medium, and said dielectric members, electrodes and dischargeable gaseous medium responding to signals applied to said input electrodes (A & B) for discharging said gaseous medium and forming a dielectric voltage level at the input electrodes (A & B) after discharge which is different than the initial dielectric voltage level at the output electrode (C) prior to said discharge, thereby enabling the subsequent voltage level of the output electrode (C) after said discharge to approach the formed dielectric voltage level at the input electrodes (A & B).

7. An AC gas discharge panel according to claim 6, wherein said output electrode (C) and one of the input electrodes (A or B) of each of the logic elements include forked portions respectively interleaved.

8. An AC gas discharge panel according to claim 6, wherein said plurality of AC gas discharge logic elements are formed at the perimeter of said panel.

9. An AC gas discharge panel according to claim 6, wherein said dielectric members are formed of different thicknesses.

10. An AC gas discharge panel according to claim 6, further including a second respective array of panel electrodes on said opposing substrate members isolated from said gaseous medium and from said first respective array of panel electrodes for sustaining said information entered into said panel.

11. An AC gas discharge panel according to claim 7, wherein said plurality of AC gas discharge logic elements are formed in at least one group having one of the input electrodes (A or B) of each logic element electrically connected.

12. An AC gas discharge panel according to claim 7, wherein said plurality of AC gas discharge logic elements are formed into a plurality of said groups, each group having one of the input electrodes (A or B) of each logic element electrically connected and having each of the other input electrodes (A or B) of the AC gas discharge logic elements in each group respectively electrically connected to the corresponding other input electrode (A or B) of each respective AC gas discharge logic element in each of said groups.

13. An AC gas discharge logic element for generating high voltage pulses to address a plasma panel comprising a dielectric member with an input electrode (B) isolated from a gaseous medium, and an input electrode (A) and output electrode (C) supportedly mounted to oppose said input electrode (B) across said gaseous medium and adapted for responding to signals applied to said input electrodes (A & B) for discharging said gaseous medium and to form a dielectric voltage level at input electrode (B) after discharge which is different than the initial voltage level at the output electrode (C) prior to said discharge, thereby enabling the subsequent voltage level of the output electrode (C) after said discharge to approach the formed dielectric voltage level at the input electrode (B), including means for connecting the output electrode (C) to a plasma panel address electrode.

14. An AC gas discharge logic element for generating high voltage pulses to address a plasma panel comprising:
a pair of spacially separated, opposing support substrates enclosing a dischargeable gaseous medium in the space defined therebetween;
a first input electrode (A) mounted to one of said support substrates in said defined space;
a second input electrode (B) mounted to the other of said support substrates in said defined space and opposing said first input electrode (A);
an output electrode (C) mounted to either one or the other of said support substrates in said defined space and opposing a corresponding respective input electrode (A or B);
a respective layer of dielectric material associated with each of said input electrodes (A and B) and said output electrode (C) and isolating said electrodes from said gaseous medium;
said input electrodes, respective layers of dielectric material, and gaseous medium adapted for responding to signals applied to said input electrodes for discharging said gaseous medium and establishing a voltage level at the respective layers of dielectric material associated with said input electrodes (A & B), after discharge, which is different than an initial voltage level at the layer of dielectric material associated with said output electrode (C), prior to said discharge, thereby enabling the subsequent voltage level of the output electrode (C) after said discharge to approach the established voltage level after said discharge at the respective layers of dielectric material associated with said input electrodes (A and B),
including means for connecting the output electrode (C) to a plasma panel address electrode.

* * * * *